United States Patent [19]
Heep et al.

[11] Patent Number: 5,294,889
[45] Date of Patent: Mar. 15, 1994

[54] BATTERY OPERATED CAPACITANCE MEASUREMENT CIRCUIT

[75] Inventors: Jerry J. Heep, Weatherford, Tex.; Douglas R. Curtis, Los Gatos, Calif.

[73] Assignee: Tandy Corporation, Fort Worth, Tex.

[21] Appl. No.: 858,857

[22] Filed: Mar. 27, 1992

[51] Int. Cl.$^5$ .............................................. G01R 27/26
[52] U.S. Cl. ........................................ 324/678; 324/676
[58] Field of Search .................. 324/676, 677, 678; 340/870.37

[56] References Cited

U.S. PATENT DOCUMENTS

| | | |
|---|---|---|
| 3,611,124 | 10/1971 | Bollons ................................ 324/677 |
| 4,217,543 | 8/1980 | Strong ................................. 324/677 |
| 4,438,498 | 3/1984 | Sekel et al. . | 
| 4,458,197 | 7/1984 | Robinson . |
| 4,492,916 | 1/1985 | Johnson . |
| 4,563,770 | 1/1986 | Lemelson et al. . |
| 4,608,532 | 8/1986 | Ibar et al. . |
| 4,736,327 | 4/1988 | Power . |
| 4,743,837 | 5/1988 | Herzog ............................... 324/678 |
| 4,794,383 | 12/1988 | Havel . |
| 4,864,512 | 9/1989 | Coulson et al. . |
| 5,073,757 | 12/1991 | George ............................... 324/677 |
| 5,146,412 | 9/1992 | Jones ................................. 324/678 |

FOREIGN PATENT DOCUMENTS 0822080 4/1981 U.S.S.R. ............................ 324/667

OTHER PUBLICATIONS

IBM Technical Disclosure Bulletin El-Kareh et al., Jan., 1991.

Primary Examiner—Michael J. Tokar
Assistant Examiner—Glenn W. Brown
Attorney, Agent, or Firm—Cesari and McKenna

[57] ABSTRACT

A capacitance measuring circuit uses only a DC voltage source to perform the capacitance measurement. For this purpose, the circuit is arranged to charge an unknown capacitor which is being measured from a DC source and to discharge the capacitor through a constant current circuit such that the discharge voltage across the capacitor decreases linearly from its initial value to a predetermined, final value. The measurement circuit monitors the time taken by the capacitor to discharge in order to determine the capacitance value.

25 Claims, 1 Drawing Sheet

BATTERY OPERATED CAPACITANCE MEASUREMENT CIRCUIT

FIELD OF THE INVENTION

This invention relates to a circuit for measuring capacitance using only direct current sources such as a battery. The circuit is especially suited for use in a battery powered digital multimeter circuit.

BACKGROUND

The measurement of circuit components in fundamental in all phases of work involving electricity and electronics. Traditionally, one of the most versatile instruments has been the hand held multimeter originally available in commercial form in a hand held case. Such a device was generally provided with various scales for reading both AC and DC voltage and both AC and DC current; for these measurements, the instrument received its power directly from the external AC or DC source. The instrument used an internal battery to actuate a galvanometer type meter indicator in order to measure passive quantities such as resistance. Since the source of voltage for such instruments was a battery, the arrangement of the circuits necessary for such measurements was straightforward and the instruments usually provided a wide range of scales for measuring and indicating each of these circuit values.

Generally, however, the original multimeters were incapable of measuring passive AC impedance quantities such as inductance and capacitance because only a DC voltage source was available and, in the prior art, the measurement of capacitance and inductance values has generally been accomplished by means of an AC bridge circuit. This conventional circuit uses either an external or internal AC signal source (typically operating at frequencies of a thousand Hertz, for example) to operate a bridge circuit, one leg of which contained the unknown AC impedance. Such bridge circuits are complicated by the fact that they require the presence of an AC signal source and further they require the bridge to be balanced and that, in turn, requires a calibrated AC impedance of like kind to that which is being measured.

In some modern versions of the multimeter circuit, a digital circuit with digital readout has been provided for giving an accurate reading of the same DC quantities and some of these units are capable of measuring AC impedances. However, these more modern circuits still use the conventional bridge technique to measure the impedances with the attendant problems discussed above.

SUMMARY OF THE INVENTION

The present invention provides a circuit that is readily adapted for use in a multimeter or other applications for the measurement of capacitance using only a DC source. For this purpose, the circuit is arranged to charge the unknown capacitor which is being measured from a DC source and to discharge the capacitor through a constant current circuit such that the discharge voltage across the capacitor decreases linearly from its initial value to a predetermined, final value. The timing of a linearly decreasing voltage can be detected much more readily then can the exponential decrease in voltage which ordinarily occurs in an RC circuit where a charged capacitor is discharged through a simple resistor.

In accordance with a preferred embodiment of this invention, a circuit is provided to measure the time interval required for the charge on the unknown capacitor to decrease from its initial charged value corresponding to the voltage supply to a discharged condition at a predetermined voltage value, illustratively, zero volts. This linear discharge provides a time interval that is independent of the source voltage and other parameters and depends solely upon the discharge resistance in the constant current discharge circuit. Thus, a simple relation for the value of the capacitance can be established as a constant factor times the time interval it takes for the capacitor to discharge.

A circuit operating in accordance with these principles can therefore be provided which operates rapidly and accurately to produce a quantity, namely the time interval, that is directly related to the capacitance value of the capacitor being measured. By suitable measurement of that time interval and indicating on an appropriate scale its relation to a range of capacitance values, the actual unknown value of the capacitor under test ca be determined.

It is accordingly an object of the present invention to provide a simple and rapidly operating circuit for measuring capacitance using only direct current sources, such as a battery.

A further object is to provide a capacitance measuring circuit which is suitable for use in a multimeter by being capable of operating from the battery source within the multimeter and providing a rapid and accurate indication of capacitance values.

A still further object of the invention is to provide a simple circuit for the measurement of capacitance values using direct current which operates with standard components and is generally independent of all parameters except the discharge resistance using a highly stable constant current circuit for the discharge of the test capacitor.

Another object is to provide a capacitance measuring circuit with multiple range scales obtained by switching the value of a single resistor in the circuit.

These and other objects of the invention will become apparent from the following detailed description taken in conjunction with the accompanying drawings.

DETAILED DESCRIPTION OF THE INVENTION

Figure 1:
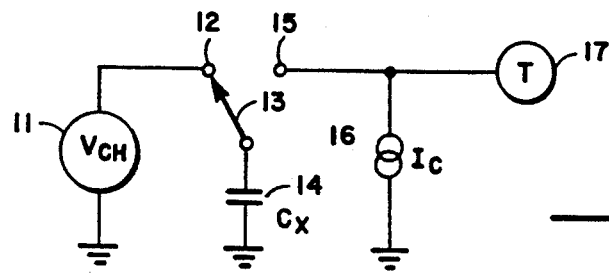
FIG. 1 is a rudimentary equivalent circuit representation useful in describing the theory of the invention.

The theory of operation of the circuit of the invention can be described with reference to FIG. 1 which shows a direct voltage source 11, such as a battery, connected to a terminal 12 of a switch 13 which is connected to a capacitor 14 which is to be measured. With switch 13 positioned as shown, the capacitor 14 will be charged to the full voltage of the battery source 11. The switch 13 can be actuated to contact a terminal 15 which disconnects capacitor 14 from the source 11 and applies the charged voltage of capacitor 14 to a constant current discharge circuit indicated schematically at 16. Also indicated schematically, is a time interval measuring circuit 17 which operates to measure the time interval it takes capacitor 14 to discharge from the voltage of source 11 to a final voltage level, which may preferably be ground or zero voltage level.

Assuming that capacitor 14 discharges to a final voltage of zero volts, the discharge time interval can be shown to be related to the resistance in the constant current discharge circuit as follows. The voltage equation at time t=0 is $$\frac{Q}{C} = Ri \quad \text{or} \quad \frac{i}{C} = R\frac{di}{dt}$$

Separating variables gives $$\frac{dt}{RC} = \frac{di}{i}$$

Integrating yields $$\frac{t}{RC} = \ln i$$

Since i is held constant $$t = kRC \quad \text{or} \quad C = \frac{t}{kR}$$

where C is the capacitance value being measured, t is the discharge time interval, R is the resistance in the discharge circuit, and k is a proportionality constant.

With this relation, the accuracy of the measurement depends only upon the accuracy of measuring the time interval and the accuracy with which R is known. In a multimeter, R can be one of the highly-accurate resistor values in the voltage divider normally employed for the voltmeter and other meter functions. Its value can be selected to make the measured time interval suitable for convenient measurement by any well known time interval measuring device.

Figure 2:
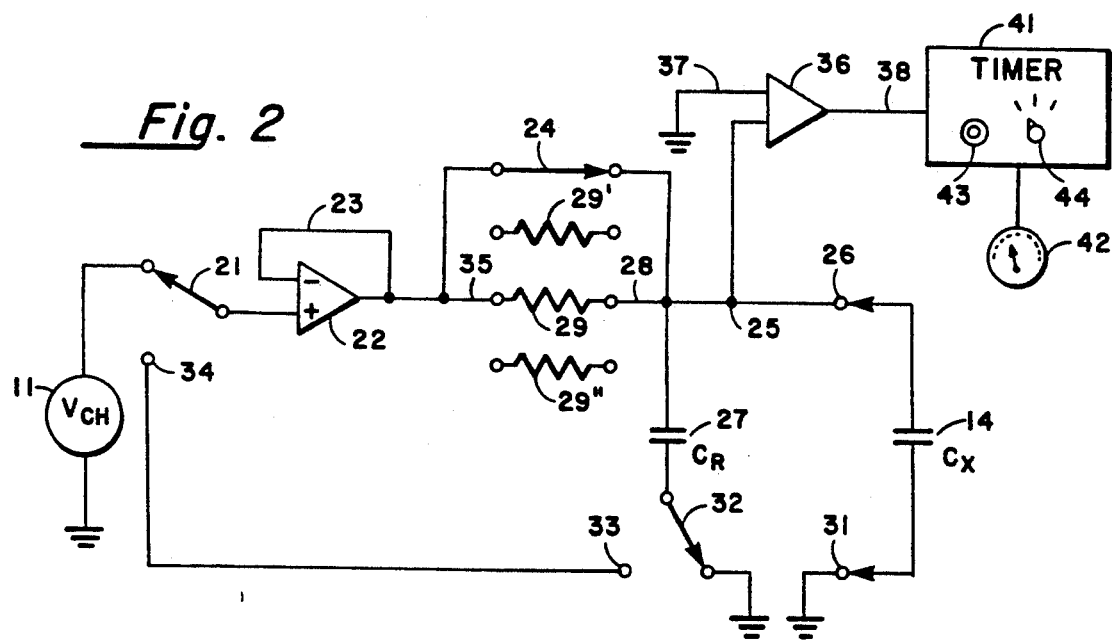
FIG. 2 is a circuit diagram of the preferred embodiment of the invention suitable for use as a capacitor measurement circuit for incorporation into a multimeter thereby adding that feature to the other circuits and measurement capabilities such instruments normally provide.

Referring now to FIG. 2, a preferred embodiment of the circuit of the invention is shown which operates on the principles described with reference to FIG. 1 and achieves the constant current discharge by a circuit which accurately maintains a constant voltage drop across the discharge resistor. As shown in FIG. 2, the circuit again relies on a direct voltage source 11, such as a battery. The circuit has a first charging configuration in which a switch 21 connects the source 11 to the positive input of a buffer operational amplifier 22. The output of the amplifier 22 is directly connected to its negative input by conductor 23 causing the amplifier to act as a voltage follower.

The output of amplifier 22 is also directly connected through a normally closed switch 24 (which shunts the discharge resistor in the charging configuration) to a node 25 to which is connected a test terminal 26, a terminal of reference capacitor 27 and, via a selector switch 28, a selected one of a group of discharge resistors 29, 29', 29". The terminal 26 cooperates with a terminal 31 to provide attachment points for connecting the unknown capacitor 14 into the test circuit as indicated. Terminal 31 is connected to ground. The remaining terminal of reference capacitor 27 is connected through a switch 32 to ground for the charging configuration as shown in the diagram.

For a second switched, or discharging, configuration, switch 24 is opened, removing the shunt from the discharge resistor, and switch 32 is operated to transfer the lower terminal of capacitor 27 to a terminal 33 which is connected to a terminal 34. In the discharging configuration, switch 21 operates to disconnect the power supply 11 from the positive input of voltage follower 22 and to connect the lower terminal of capacitor 27 to the positive input of the voltage follower amplifier 22 instead.

A selected discharge resistor 29 is connected through a switch 35 to the output of buffer amplifier 22 and through switch 28 to terminal 26. Thus in the second switched condition, capacitor 14 is connected to discharge through resistor 29 with constant current maintained by the buffer amplifier 22 as described below.

Also connected to node 25 is an input to a comparator circuit 36 which operates with reference to a grounded input 37 to produce an output on line 38 when the voltage at node 25 reaches ground level.

A timer 41 of any suitable type is shown as having some form of indicator 42 scaled to indicate capacitance as a function of the time interval measured by the timer 41. Indicator 42 is designed to display capacitance based on the capacitance/time relationship described above, taking into account the value of the discharge resistor.

Timer 41 is also indicated as having a push button switch 43 which can be actuated to initiate capacitance measurement and as having a scale selector 44 to select, for example, decade ranges of capacitance. These ranges would be calibrated to correspond to a plurality of values for resistor 29 indicated schematically as 29' and 29" which would be switched into the discharge circuit by switch elements 28 and 35 to correspond to the scale change effected by selector switch 44.

With the arrangement shown for the charging configuration, switch 21 connects the voltage source 11 to voltage follower 22. Voltage follower 22 thereupon applies, via closed switch 24, the voltage source voltage to reference capacitor 27 and an unknown capacitor 14 connected to terminals 26 and 31 to charge these capacitances in parallel to the source voltage.

After the capacitors 14 and 27 are charged, the measurement cycle is initiated by starting the timer, symbolically represented by actuating switch 43, which simultaneously actuates the various switches to place the circuit in the discharge configuration as follows: switch 21 will transfer its movable contact to contact 34, switch 24 will open circuit the bypass around resistor 29 and switch 32 will transfer the lower terminal of capacitor 27 to contact 33.

In this configuration, the voltage across charged capacitor 27 is impressed across the series connection of voltage follower 22 and discharge resistor 29. Voltage follower 22 thereupon applies the voltage on capacitor 27 across discharge resistor 29. Due to the high input impedance of a typical operation amplifier, reference capacitor 27 cannot discharge and, consequently, the full voltage of power supply 11 (to which capacitor 27 was previously charged) will remain applied across resistor 29 throughout the entire discharge cycle of operation. Therefore, resistor 29 will act as a constant current source to discharge capacitor 14. As the voltage across capacitor 14 changes, this change is applied to the input of follower 22 by means of charged capacitor 14 causing the output of follower 22 to track the changing voltage across capacitor 14, thereby maintaining a constant voltage across resistor 29.

Figure 3:
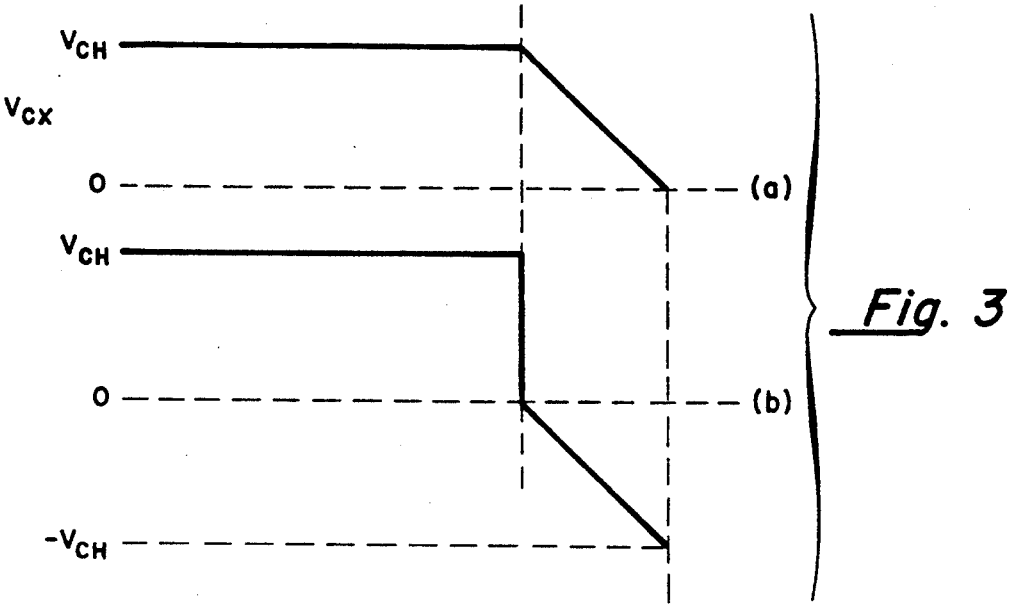
FIG. 3 is a waveform diagram showing the charge and discharge voltages that are present in the constant current discharge circuit.

Capacitor 14 thus discharges through resistor 29 to the power source (via the output of amplifier 22) with a linearly falling voltage until it is completed discharged. The voltages in the circuit versus time during a measurement are indicated in FIG. 3. FIG. 3a shows the voltage cross capacitor 14 from the time when it is fully charged to the voltage V of source 11. At the moment the measurement starts (indicated as point 300) the voltage V across capacitor 14 begins to fall linearly. This occurs because the voltage at the positive input of voltage follower 22 has dropped from the source voltage V to zero due to the reverse polarity of the voltage across capacitor 27 being applied from the node 25 to the positive input of follower 22. The constant current discharge through resistor 29 produces a linearly falling voltage at node 25 which the follower 22 tracks from zero down to minus V as shown in FIG. 3b. Thus, the falling voltage on capacitor 14 indicated in FIG. 3a is matched by a negative falling voltage below zero as indicated in FIG. 3b to maintain a constant voltage difference across resistor 29 and thus maintain the constant discharge current required for the measurement.

When capacitor 14 has been completely discharged, the voltage at node 25 will be zero corresponding to the ground input of comparator 36 which will then produce an output on line 38 to stop the timing of timer 41. The time interval elapsed during the linearly decreasing voltages in FIG. 3 is represented by the timer value and the indicator 42, being suitably calibrated to the value of resistor 29, can be read in terms of the capacitance of capacitor 14.

Obviously the circuit as described can be incorporated to operate in conjunction with the various other circuits in a multimeter and in particular, as described, the resistor 29 can take advantage of the precision voltage divider resistors which already exist in such instruments. In addition, the various initiation, switching, reset and scale selection functions can be achieved by control from a microprocessor to provide an integrated multi purpose instrument. Timer 42 may be modified to directly drive a binary or other counter, thereby directly generating a digital word whose value at the end of the measurement cycle represents the unknown capacitance value.

Various modifications of the circuit disclosed as the preferred embodiment can be made by those skilled in the art and such obvious modifications are to be considered within the scope of the appended claims.

What is claimed is:

1. Apparatus for measuring a capacitance value of a capacitor, said apparatus comprising:
    A) a voltage source;
    B) means for charging said capacitor from said voltage source, whereby a voltage is impressed across said capacitor, said voltage having an initial value;
    C) means for discharging said capacitor with a current having a magnitude proportional to said voltage, whereby said voltage across said capacitor decreases substantially linearly from said initial value to a predetermined final value; and.
    D) timing means connected to said capacitor for measuring a time interval taken by said capacitor to discharge to said final voltage value, said time interval indicating said capacitance value.

2. Apparatus for measuring a capacitance value according to claim 1 wherein said discharging means comprises a constant current source.

3. Apparatus for measuring a capacitance value according to claim 2 wherein said constant current source comprises a resistor and means for generating a constant voltage across said resistor.

4. Apparatus for measuring a capacitance value according to claim 3 wherein said constant voltage generating means comprises a reference capacitor, means connected to said charging means for charging said reference capacitor to said initial voltage and means for impressing a second voltage from said charged reference capacitor across said resistor.

5. Apparatus for measuring a capacitance value according to claim 2 further comprising means for connecting said constant current source to said capacitor and means cooperating with said connecting means for starting said timing means when said constant current source is connected to said capacitor.

6. Apparatus for measuring a capacitance value according to claim 5 further comprising means connected to said capacitor and responsive to the voltage on said capacitor for stopping said timing means when a voltage on said capacitor equals said predetermined final voltage.

7. A method for measuring a capacitance value of a capacitor, said method comprising the steps of:
    A. charging said capacitor by impressing a voltage across said capacitor at an initial value;
    B. discharging said capacitor with a current having a magnitude proportional to said initial voltage value, whereby said voltage across said capacitor decreases substantially linearly from said initial value to a predetermined final value; and
    C. measuring a time interval taken by said capacitor to discharge to said final voltage value, said time interval indicating said capacitance value.

8. A method for measuring a capacitance value according to claim 7 wherein step B comprises the step of:
    B1. discharging said capacitor with a current having a constant magnitude.

9. A method for measuring a capacitance value according to claim 8 wherein step B1 comprises the steps of:
    B1A. generating a constant voltage; and
    B1B. impressing said constant voltage across a resistor.

10. A method for measuring a capacitance value according to claim 9 wherein step B1A comprises the steps of:
    B1A'. charging a reference capacitor to said initial voltage; and
    B1A". impressing a voltage on said charged reference capacitor across said resistor.

11. A method for measuring a capacitance value according to claim 8 wherein step B further comprises the step of:
    B2. connecting said constant current source to said capacitor.

12. A method for measuring a capacitance value according to claim 11 wherein step C further comprises the step of:
    C1. starting a timer when said constant current source is connected to said capacitor.

13. A method for measuring a capacitance value according to claim 12 wherein step C further comprises the step of:

C2. stopping said timer when a voltage on said capacitor equals said predetermined final voltage.

14. A capacitance measurement instrument for measuring a capacitance value of a capacitor, said instrument comprising:
   A) a voltage source for generating a constant initial value of direct voltage;
   B) means connected to said voltage source and said capacitor for charging said capacitor to said initial voltage value;
   C) a resistor connected to said capacitor;
   D) means connected to said resistor for impressing a constant voltage having a magnitude proportional to said initial voltage across said resistor causing a constant current to discharge said capacitor; and
   E) timing means connected to said capacitor for determining a time interval required to discharge said capacitor from said initial voltage value to a predetermined final voltage value, said time interval indicating said capacitance value.

15. The instrument according to claim 14 further comprising means for changing a value of said resistor in order to change said time interval.

16. A capacitance measurement instrument for measuring a capacitance value of a capacitor, said instrument comprising:
   A) a voltage source for generating a constant initial value of direct voltage;
   B) means connected to said capacitor and said voltage source for charging said capacitor to said initial voltage value;
   C) a resistor connected to said capacitor;
   D) means connected to said resistor for impressing a constant voltage having a magnitude proportional to said initial voltage across said resistor causing a constant current to discharge said capacitor during a time interval required to discharge said capacitor from said initial voltage value to a predetermined final voltage value, said impressing means comprising:
      1) a reference capacitor;
      2) means connected to said reference capacitor for charging said reference capacitor to said initial voltage value;
      3) a voltage follower connected to said resistor to provide a discharge path of said capacitor; and
      4) means operable at a beginning of said time interval to connect said reference capacitor to said voltage follower for maintaining a constant voltage across said resistor during said time interval; and
   E) timing means connected to said capacitor for determining said time interval, said time interval indicating said capacitance value.

17. Apparatus for measuring a capacitance value of a capacitor as a function of the discharge time of said capacitor using only direct current comprising:
   A) a direct current, constant voltage source for generating an initial voltage;
   B) a resistor;
   C) circuit means connected to said voltage source and said resistor and operable to first charge said capacitor to said initial voltage and subsequently to discharge said capacitor with a constant current discharge through said resistor; and
   D) timing means connected to said capacitor for determining the interval required to discharge said capacitor from said initial voltage to a final, predetermined voltage.

18. Apparatus according to claim 17 further comprising a buffer amplifier and a reference capacitor and wherein said circuit means has a first switchable condition for charging both said capacitor and said reference capacitor to said initial voltage and a second switchable condition for connecting said reference capacitor as an input to said buffer amplifier and for connecting said capacitor to discharge through said resistor and through said buffer amplifier so that said buffer amplifier maintains a constant voltage drop across said resistor during said time interval thereby providing constant current discharge.

19. Apparatus according to claim 18 wherein said timing means comprises:
   means connected to said circuit means for initiating a timing interval when said circuit means enters said second switchable condition; and
   means responsive to a voltage across said capacitor for terminating said timing interval when said voltage equals said predetermined final value.

20. Apparatus according to claims 17, 18 or 19 further comprising means for selectively providing different values for said resistor for altering a length of said discharge interval.

21. A test circuit for measuring a capacitance value of a capacitor using only direct current, said test circuit comprising:
   A) a direct current, constant voltage source;
   B) a buffer amplifier having an input;
   C) a resistor;
   D) a reference capacitor;
   E) a voltage comparator having an output;
   F) a switching circuit operable:
      a. in a first switched condition, to connect said voltage source through said buffer amplifier to a node common to said capacitor and to said reference capacitor for charging both said capacitor and said reference capacitor;
      b. in a second switched condition,
         i. to disconnect said voltage source from said buffer amplifier,
         ii. to connect the voltage across said charged reference capacitor from said node to said buffer amplifier input, and
         iii. to connect said node through said resistor to the output of said buffer amplifier thereby providing a constant current discharge path through said resistor for said capacitor; and
   G) a circuit connecting said voltage comparator to said node for determining when said capacitor being measured is completely discharged.

22. Apparatus according to claim 21 further comprising timing means responsive to said switching circuit changing from said first switched condition to said second switched condition for initiating timing and responsive to said output of said comparator to terminate timing in order to obtain a time interval required to discharge said capacitor.

23. Apparatus according to claims 21 or 22 further comprising means for selecting different resistance values for said resistor.

24. Apparatus according to claim 21 further comprising indicator means for indicating capacitance values in accordance with a length of said time interval measured for discharge of said capacitor.

25. A capacitance measurement instrument for measuring a capacitance value of a capacitor, said instrument comprising:
A) a voltage source for generating a constant initial value of direct voltage;
B) means connected to said capacitor for charging said capacitor to said initial voltage value;
C) a resistor connected to said capacitor;
D) means connected to said capacitor for impressing a constant voltage having a magnitude proportional to said initial voltage across said resistor causing a constant current to discharge said capacitor, said impressing means comprising
E) a reference capacitor;
F) means connected to said reference capacitor for charging said reference capacitor to said initial voltage value;
G) a voltage follower connected to said resistor to provide a discharge path of said capacitor; and
H) timing means connected to said capacitor for determining a time interval required to discharge said capacitor from said initial voltage value to a predetermined final voltage value, said time interval indicating said capacitance value;
I) means operable at a beginning of said time interval to connect said reference capacitor to said voltage follower for maintaining a constant voltage across said resistor during said time interval; and
J) means for changing a value of said resistor in order to change said time interval.

* * * * *